(12) United States Patent
Yang et al.

(10) Patent No.: US 10,938,157 B2
(45) Date of Patent: Mar. 2, 2021

(54) HIGH SPEED ELECTRICAL CONNECTOR FOR COMPACT ELECTRONIC SYSTEMS

(71) Applicants: Amphenol AssembleTech (Xiamen) Co., Ltd, Fujian (CN); Amphenol East Asia Ltd., Taoyuan (TW)

(72) Inventors: Wen Chu Yang, Xiamen (CN); Hang Li, Xiamen (CN); Shujian Wang, Xiamen (CN); Hui Tang, Xiamen (CN); Zhenxing Liu, Xiamen (CN); Xiyin Zhou, Xiamen (CN); Lo-Wen Lu, Taoyuan (TW); Wen Te Hsu, Taoyuan (TW)

(73) Assignees: Amphenol AssembleTech (Xiamen) Co., Ltd, Fujian (CN); Amphenol East Asia Ltd., Taoyuan (TW)

( * ) Notice: Subject to any disclaimer, the term of this patent is extended or adjusted under 35 U.S.C. 154(b) by 0 days.

(21) Appl. No.: 16/299,542

(22) Filed: Mar. 12, 2019

(65) Prior Publication Data

US 2020/0076126 A1 Mar. 5, 2020

(30) Foreign Application Priority Data

Sep. 3, 2018 (CN) .......................... 2018 1 1021374
Sep. 3, 2018 (CN) ..................... 2018 2 1434180 U

(51) Int. Cl.
*H01R 13/627* (2006.01)
*H01R 12/79* (2011.01)
(Continued)

(52) U.S. Cl.
CPC ......... *H01R 13/6275* (2013.01); *H01R 12/79* (2013.01); *H01R 43/26* (2013.01);
(Continued)

(58) Field of Classification Search
CPC ............ H01R 13/6275; H01R 13/6335; H01R 13/6658; H01R 24/60; H01R 13/506;
(Continued)

(56) References Cited

U.S. PATENT DOCUMENTS 5,466,171 A 11/1995 Bixler et al.
5,474,461 A * 12/1995 Saito ................ H01R 13/62933
439/157
(Continued)

FOREIGN PATENT DOCUMENTS

CN 304240766 S 8/2017
CN 304245430 S 8/2017
(Continued)

OTHER PUBLICATIONS

U.S. Appl. No. 16/299,622, Yang et al., filed Mar. 12, 2019.
(Continued)

*Primary Examiner* — Mandeep S Buttar
(74) *Attorney, Agent, or Firm* — Wolf, Greenfield & Sacks, P.C.

(57) ABSTRACT

A connector assembly with latching provided by a rotating latch bar. The connector has a low height, with the rotating latch bar providing secure engagement between mated connectors of the connector assembly. The latch bar may be shaped to provide spring force that urges the mated connectors together. The connector assembly may be formed with a cable connector and a board connector. The low height of the board connector enables the connector to be mounted close to high speed electronic components, such as a processor, even if covered by a heat sink, as the connector may fit under the heat sink. The cable connector may be coupled, via a cable, to an I/O connector or other component remote from the high speed electronic component.

23 Claims, 5 Drawing Sheets

(51) Int. Cl.
*H01R 43/26* (2006.01)
*H05K 1/02* (2006.01)
*H05K 1/18* (2006.01)

(52) U.S. Cl.
CPC .............. *H05K 1/0203* (2013.01); *H05K 1/18* (2013.01); *H05K 2201/10189* (2013.01); *H05K 2201/10522* (2013.01)

(58) Field of Classification Search
CPC ............ H01R 13/6594; H01R 13/6273; H01R 13/659; H01R 9/03; H01R 13/508; H01R 24/00; H01R 13/6272; H01R 13/6582; H01R 24/62; H01R 12/721; H01R 12/716; H01R 12/722; H01R 13/62933; H01R 13/627; H01R 12/88; H01R 13/4226; G02B 6/3825; G02B 6/3893; G02B 6/3879; H05K 2201/09145; H05K 5/0221
USPC ........ 361/704; 439/352, 345, 350, 483, 370, 439/626, 660, 372, 552, 638
See application file for complete search history.

(56) References Cited

U.S. PATENT DOCUMENTS

| | | | |
|---|---|---|---|
| 5,713,755 A | 2/1998 | Koopman et al. | |
| 5,961,399 A | 10/1999 | Koopman et al. | |
| 5,971,789 A | 10/1999 | Sukegawa | |
| 6,203,359 B1 | 3/2001 | Lee | |
| 6,364,718 B1 | 4/2002 | Polgar et al. | |
| 6,416,354 B1 | 7/2002 | Lee | |
| 6,558,186 B1 | 5/2003 | LePottier et al. | |
| 6,705,885 B1 | 3/2004 | Lin et al. | |
| 6,749,458 B1 | 6/2004 | Kuo et al. | |
| 6,830,464 B1* | 12/2004 | Friend | H01R 13/639 439/74 |
| 6,863,549 B2 | 3/2005 | Brunker et al. | |
| 6,969,268 B2 | 11/2005 | Brunker et al. | |
| 7,094,092 B2 | 8/2006 | Yang | |
| 7,137,832 B2 | 11/2006 | Mongold et al. | |
| 7,335,063 B2 | 2/2008 | Cohen et al. | |
| 7,479,017 B1 | 1/2009 | Koopman et al. | |
| 8,075,324 B2 | 12/2011 | Yamaji et al. | |
| 8,226,441 B2 | 7/2012 | Regnier et al. | |
| 8,388,370 B2* | 3/2013 | Yamaji | H01R 13/62994 439/497 |
| 8,465,302 B2 | 6/2013 | Regnier et al. | |
| 8,597,055 B2 | 12/2013 | Regnier et al. | |
| 8,727,803 B2 | 5/2014 | Kurachi | |
| 8,727,809 B2 | 5/2014 | Mongold et al. | |
| 8,870,600 B2 | 10/2014 | Wu et al. | |
| 8,979,551 B2 | 3/2015 | Mongold et al. | |
| 9,070,987 B2 | 6/2015 | Knowlden et al. | |
| 9,130,313 B2 | 9/2015 | Mongold et al. | |
| 9,660,361 B2 | 5/2017 | Knowlden et al. | |
| 9,991,641 B1 | 6/2018 | Annis et al. | |
| 2003/0148647 A1* | 8/2003 | Hisamatsu | H01R 13/6335 439/258 |
| 2003/0222282 A1* | 12/2003 | Fjelstad | H01L 23/49805 257/200 |
| 2004/0235324 A1 | 11/2004 | Kimura et al. | |
| 2004/0242050 A1 | 12/2004 | Ke et al. | |
| 2005/0277334 A1 | 12/2005 | Huang | |
| 2010/0144177 A1 | 6/2010 | Vicich et al. | |
| 2011/0280520 A1* | 11/2011 | Shimotsu | G02B 6/4201 385/76 |
| 2012/0171890 A1* | 7/2012 | Kurachi | H01R 13/639 439/372 |
| 2015/0303608 A1 | 10/2015 | Zerebilov et al. | |
| 2019/0173209 A1 | 6/2019 | Lu et al. | |
| 2019/0173232 A1 | 6/2019 | Lu et al. | |
| 2020/0076132 A1 | 3/2020 | Yang et al. | |

FOREIGN PATENT DOCUMENTS

| | | |
|---|---|---|
| CN | 206712089 U | 12/2017 |
| CN | 304493773 S | 6/2018 |
| CN | 207677189 U | 7/2018 |
| EP | 1172673 A2 | 1/2002 |
| EP | 0836246 B1 | 7/2002 |
| JP | 2008-112700 A | 5/2008 |
| JP | 4286279 B2 | 6/2009 |
| TW | M558481 U | 4/2018 |
| TW | M558482 U | 4/2018 |
| TW | M558483 U | 4/2018 |
| TW | M559006 U | 4/2018 |
| TW | M559007 U | 4/2018 |
| TW | M560138 U | 5/2018 |
| TW | M562507 U | 6/2018 |
| TW | M565894 Y | 8/2018 |
| TW | M565895 Y | 8/2018 |
| TW | M565899 Y | 8/2018 |
| TW | M565900 Y | 8/2018 |
| TW | M565901 Y | 8/2018 |
| WO | WO 2018/039351 A1 | 3/2018 |

OTHER PUBLICATIONS

U.S. Appl. No. 16/556,728, Lu, filed Aug. 30, 2019.
U.S. Appl. No. 16/556,778, Lu, filed Aug. 30, 2019.
U.S. Appl. No. 16/684,755, Lu, filed Nov. 15, 2019.
U.S. Appl. No. 16/299,622, Lu, filed Dec. 19, 2019.
[No Author Listed], Cabline-CA 0.4mm Pitch Horizontal Type. I-PEX by Dahchi Seiko. 2015. 3 pages.
[No Author Listed], Cabline-CA 0.5mm Pitch Horizontal Type. I-PEX by Dahchi Seiko. 2015. 3 pages.
[No Author Listed], Firefly Application Design Guide. Samtec. Jan. 2017. 12 pages.
[No Author Listed], NearStack High-Speed Connector System and Cable Jumper Assemblies. Preliminary Datasheet. Molex 2017. 2 pages.
Hou et al., Low Crosstalk Card Edge Connector, U.S. Appl. No. 16/760,400, filed Apr. 29, 2020.
Hsu et al., SMT Receptacle Connector With Side Latching, U.S. Appl. No. 16/695,062, filed Nov. 25, 2019.
Hsu, High Reliability Smt Receptacle Connector, U.S. Appl. No. 16/905,593, filed Jun. 18, 2020.
Lu et al., Compact Electrical Connector, U.S. Appl. No. 16/827328, filed Mar. 23, 2020.

* cited by examiner

HIGH SPEED ELECTRICAL CONNECTOR FOR COMPACT ELECTRONIC SYSTEMS

CROSS REFERENCE TO RELATED APPLICATIONS

This application claims priority to and the benefit of Chinese Patent Application No. 201811021374.6, filed Sep. 3, 2018, and Chinese Patent Application No. 201821434180.4, filed Sep. 3, 2018. The entire contents of these applications are incorporated herein by reference in their entirety.

FIELD OF THE INVENTION

This disclosure relates generally to electronic systems and more specifically to miniaturized electrical connectors able to carry high-frequency signals.

BACKGROUND

Electrical connectors are used in many electronic systems. In general, various electronic devices (e.g., smart phones, tablet computers, desktop computers, notebook computers, digital cameras, and the like) have been provided with assorted types of connectors whose primary purpose is to enable an electronic device to exchange data, commands, and/or other signals with one or more other electronic devices. Electrical connectors are basic components needed to make some electrical systems functional. Signal transmission to transfer information (e.g., data, commands, and/or other electrical signals) often utilize electrical connectors between electronic devices, between components of an electronic device, and between electrical systems that may include multiple electronic devices.

It is generally easier and more cost effective to manufacture an electrical system as separate electronic assemblies, such as printed circuit boards ("PCBs"), which may be communicatively joined together with electrical connectors. In some scenarios, the PCBs to be joined may each have connectors mounted on them. The connectors may be mated together directly to interconnect the PCBs.

In other scenarios, the PCBs may be connected indirectly via a cable. Electrical connectors may nonetheless be used to make such connections. For example, the cable may be terminated one or both ends with a plug type of electrical connector ("plug connector" herein). A PCB may be equipped with a board electrical connector, containing an opening ("receptacle connector" herein) into which the plug connector may be inserted to connect the cable to the PCB. A similar arrangement may be used at the other end of the cable, to connect the cable to another PCB, so that signals may pass between the PCBs via the cable.

To facilitate manufacture of different parts of electronic devices in different places by different companies, aspects of the receptacle connectors and the plug connectors may be standardized, either through a formal standard-setting process or through adoption of a particular design by a large number of manufacturers. An example of an interconnection standard is the SAS or Serial Attached SCSI (Small Computer System Interface) standard. Another example is the SFP or Single Form-Factor Pluggable standard, as well as its variations: SFP+, QSFP, QSFP+, etc. Different standards have been developed as electronic devices generally have gotten smaller, faster, and functionally more complex. The different standards allow for different combinations of speed and density within a connector system.

For electronic devices that require a high-density, high-speed connector, techniques may be used to reduce interference between conductive elements within the connectors, and to provide other desirable electrical properties. One such technique involves the use of shield members between or around adjacent signal conductive elements of a connector system. The shields may prevent signals carried on one conductive element from creating "crosstalk" on another conductive element. The shields may also have an impact on an impedance of the conductive elements, which may further contribute to desirable electrical properties of the connector system.

Another technique that may be used to control performance characteristics of a connector entails transmitting signals differentially. Differential signals result from signals carried on a pair of conducting paths, called a "differential pair." The voltage difference between the conductive paths represents the differential signal. In general, a differential pair is designed with preferential coupling between the conducting paths of the pair. For example, the two conducting paths of a differential pair may be arranged to run closer to each other than to other adjacent signal paths in the connector.

SUMMARY

Disclosed in the present application is a cable connector with a rotating latch bar. The connector may include a connector body, the rotating latch bar and a pull tab, which may be implemented as a belt attached to the latch bar. A cable may be connected to a tail part of the connector body. One end of the rotating latch bar may be a connection end, and another end may be an engagement end. One end of the connection end may be rotatably mounted on the connector body, and another end may be fixed to the engagement end. The engagement end may be arranged to be inclined upward, and the engagement end may be fixed at an upper side to the pull tab.

Also disclosed in the present application are a connector assembly and a method for using the same. The rotating latch bar may be used to accomplish interlocking of a cable connector and a board connector. Compared with latching by a conventional latch, the disclosed designs may provide 4.5 Kgf minimum latching force, in some embodiments, and little or no gap between mated connectors. The rotating latch bar may be disengaged from engagement slot of the board connector by applying force to the pull tab. The design may enable the cable connector to be withdrawn from a board connector at the same time as unlatching is accomplished.

In some embodiments, the engagement end of the rotating latch bar may be inclined upward, and the engagement end may be fixed at an upper side to the pull tab.

In some embodiments, the connection end may comprise two connecting bars disposed symmetrically on left and right sides of the cable connector. Each of the two connecting bars may have one end rotatably mounted on the connector body, and another end fixed to the engagement end.

In some embodiments, the engagement end may have engagement arms, first connecting arms, second connecting arms and a pull tab bar. Extremities of the two connecting bars may be bent perpendicularly inward to form two engagement arms respectively. Extremities of the two engagement arms may be bent perpendicularly upward to form two first connecting arms. Extremities of the two first connecting arms may be bent obliquely toward a side of the connector body to form two second connecting arms. Further, extremities of the two second connecting arms may each be bent perpendicularly inward and closed together to form the pull tab bar.

In some embodiments, a forward end of the pull tab may be attached to the pull tab bar. The forward end of the pull tab may be arranged obliquely with respect to the rotating latch bar.

In some embodiments, the pull tab may be in the form of a strip-like belt, which may be formed from a material such as rubber or nylon.

In some embodiments, the pull tab bar may be metal.

It should be appreciated that the foregoing features may be used together or separately in some embodiments. Various embodiments may include some or all of the features described herein and may provide some or all of the features described herein.

Such connectors may be used in a connector assembly, comprising a board connector and the cable connector described above. The bottom of the board connector may be connected to a circuit board, and the cable connector may be shaped with a slot to receive the board connector for mating. Left and right sides of the board connector may each be shaped with an engagement block. Each engagement block may fit within an engagement slot at an end the cable connector remote from the mating interface. The engagement end of the rotating latch bar may engaged with the engagement slot.

Furthermore, the engagement block is provided with a projection at an end close to the cable connector, and a forward end of the cable connector is provided with a recess for engaging with the projection.

Furthermore, in order to enable the rotating latch bar to be conveniently withdrawn after unlatching, the board connector may be provided with an inclined face at an end remote from the cable connector.

Also disclosed in the present invention is a method of operating a connector assembly, such as a connector described above, comprising the following steps:

step 1: to assemble, the board connector may be inserted into a slot of the cable connector, and the rotating latch bar may be rotated such that the engagement end of the rotating latch bar is engaged in the engagement slots of the board connector, to complete the assembly of the connector assembly; and step 2: to unlatch, the pull tab is pulled toward a side remote from the board connector, and the pull tab drives the engagement end of the rotating latch bar to disengage from the engagement slots of the board connector, to accomplish unlatching and separation of the cable connector and the board connector.

Also disclosed is a board connector, comprising a housing comprising a mating interface on a first side of the housing, an upper surface and an engagement slot configured to receive a latch bar on a side of the housing opposite the mating interface.

In some embodiments, the engagement slot is a first engagement slot and the housing further comprises a second engagement slot, and the housing may further comprise engagement blocks on opposing sides of the board connector, and the engagement blocks each comprise a respective one of the first engagement slot and the second engagement slot.

In some embodiments, the first and second engagement blocks may comprise projections at an end of the engagement block opposite the engagement slot.

In some embodiments, the upper surface of the housing comprises an inclined face at an end adjacent the engagement slots.

In some embodiments, the housing has a height less than 5 mm.

The foregoing features may be used, separately or together in any combination, in any of the embodiments discussed herein.

BRIEF DESCRIPTION OF DRAWINGS

Various aspects and embodiments of the present technology disclosed herein are described below with reference to the accompanying figures. It should be appreciated that the figures are not necessarily drawn to scale. Items appearing in multiple figures may be indicated by the same reference numeral. For the purposes of clarity, not every component may be labeled in every figure.

Figure 1:
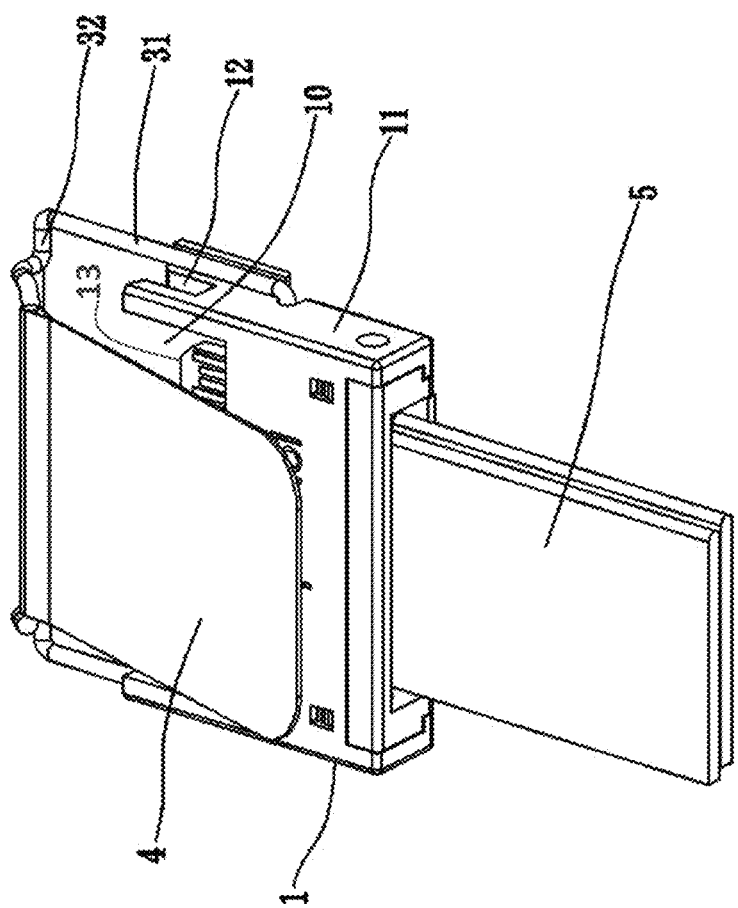
FIG. 1 is a perspective view of an exemplary embodiment of a cable connector, configured as a plug with a rotating latch bar.

The following labels are used to identify principal components illustrated in the drawings:

1—cable connector;
10—mating interface;
11—connector body;
12—recess;
13—paddle card
14—arms
2—board connector;
21—engagement block;
211—engagement slot;
212—projection;
213—rounded end;
22—circuit board;
23—inclined face;
24—mating interface
25—slot
3—rotating latch bar;
31—connecting bar;
32—engagement arm;
33—first connecting arm;
34—second connecting arm;
35—pull tab bar;
4—pull tab;
5—cable.
80—electronic system
81—I/O connector
82—printed circuit board
83—electronic component
84—connector assembly
85—cable 86—processor
87—heat sink

DETAILED DESCRIPTION

The inventors have recognized and appreciated that that the manufacture of a compact electronic system that processes high speed signals may be enabled by a miniaturized electrical connector of low height, such as 5 mm or less, relative to a surface of a printed circuit board to which the connector system is mounted. The inventors have further recognized and appreciated that such a miniaturized electrical connector can be achieved with a latching structure using a rotating latch bar.

Such a connector may have a height less than other components that might otherwise be on a printed circuit board in the system. The rotating latching bar may be shaped to add little or no height above a housing of the connector, yet, may securely latch the connector to a mating electrical connector, such as by exerting spring force that urges the mating connectors together when latched. That spring force may be in the range of 1 to 10 Kgf or in the range of 4 to 15 Kgf or greater than 4.5 Kgf, in various embodiments. Secure latching may promote reliable operation of the system by avoiding problems that might otherwise occur were the mated connectors free to move relative to each other over a range of motion allowed by conventional latching systems. Such problems could include intermittent disconnection of the mating contacts within the connectors, separation of the connectors sufficient to break connections between the mating contacts, changes in impedance of the signal paths, and fretting of mating contacts of the connectors and eventual failure of the interconnects that might result were the connectors able to move relative to each other while mated.

Such problems might arise, for example, with conventional latches that employ a barb on one connector engaged in a hole or slot on a mating connector. These components are designed to provide a mating tolerance such that the barb will engage the hole even if one or both of the mating connectors is not manufactured to exactly its nominal dimensions. However, because the barb and hole are designed with a clearance fit, the tolerance ensures that the hole will be larger than the barb such that the barb can move within the hole. As a result, the mated connectors may move with respect to each other, with the risk of unstable contact or other problems that can result from motion of the mated connectors. These problems are exacerbated for compact systems in which the size of the latch is limited, such as when the height of the connector is restricted to 4.5 mm, such that the retaining force between the mated connectors is inevitably limited.

In contrast, connectors as described herein may have a rotating latch bar to latch the cable connector and the board connector with adequate latching force, small mating gap and easy unlatching. The mating gap between mated connectors, for example may be so small as to be not visibly discernible, in some embodiments or less than 0.5 mm in some embodiments, or less than 0.1 mm in some embodiments. The connectors may be easily unmated. As a result of the pull tab being connected to the pull tab bar of the rotating latch bar, the engagement arms of the rotating latch bar are disengaged from the engagement slots of the board connector by applying force to the pull tab. The cable connector may be then withdrawn from a board connector at the same time as unlatching is accomplished.

Further, the unlatching structure occupies little space, and the structure is compact, making it easier to realize product functions. The unlatching structure need not occupy space in left and right directions, parallel to the surface of a printed circuit board to which the connector assembly is mounted nor does space to the left and right need to be provided to access the unlatching structure. In such embodiments, multiple connectors may be mounted side by side to the same printed circuit board with a small minimum distance between two connectors. That distance may be on the order of 1 mm, and may for example, be in the range of 0.5 mm to 5 mm, or between 0.75 and 3 mm or between 0.75 and 1.5 mm in various embodiments. In some embodiments, the forward end of the pull tab may be arranged obliquely with respect to the rotating latch bar, such that the pull tab forms an angle with the rotating latch bar. This configuration facilitates the guiding of force, and facilitates unlatching. Further, the rotating latch bar may have multiple bends such that the pull tab may be attached to the rotating latch bar at a segment of the latch bar that is offset relative to the segments that engage the mating connector.

A representative embodiment is explained further below with reference to the accompanying drawings. In the illustrated embodiment, the rotating latch bar is attached to a plug connector terminating a cable of a cable assembly. The mating connector is a board connector, configured as a receptacle connector, mounted to a printed circuit board. However, it should be appreciated that a rotating latch bar may be used in conjunction with mating connectors in other configurations.

Figure 2:
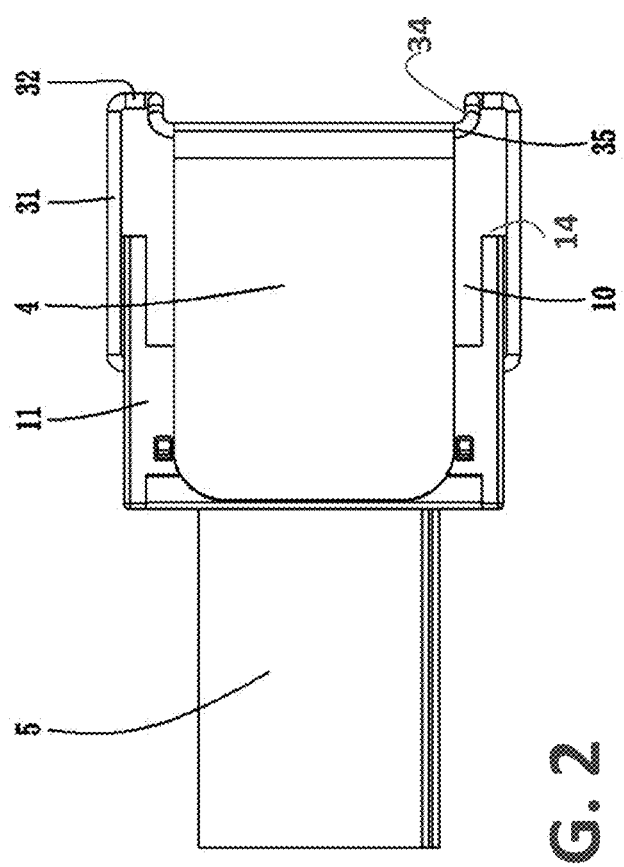
FIG. 2 is a top plan view of FIG. 1.
Figure 3:
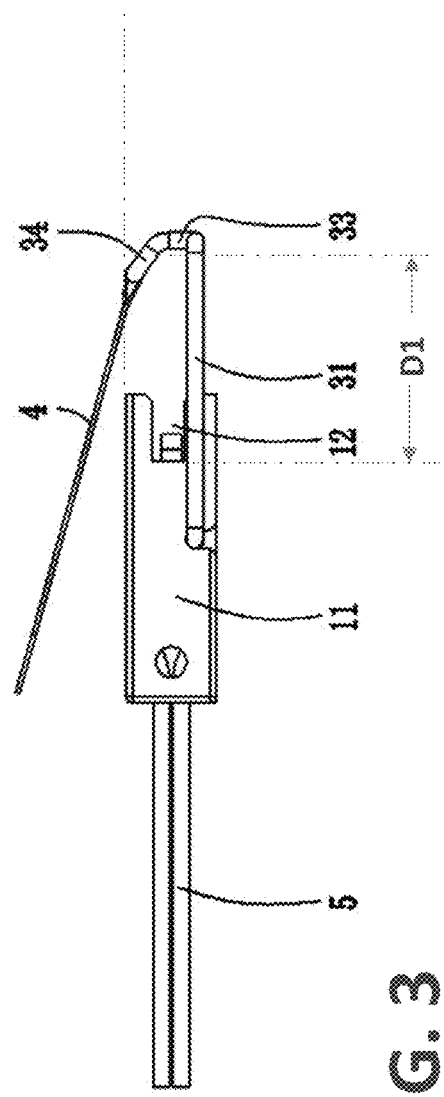
FIG. 3 is a side view of FIG. 1.

As shown in FIGS. 1-3, a cable connector 1 with a rotating latch bar comprises a connector body 11, a rotating latch bar 3 and a pull tab 4. The pull tab 4 may be made of a sheet of flexible material. In the embodiment illustrated, the pull tab 4 is made of a sheet of nylon.

Connector body 11 may be formed of an insulative material, such as plastic, which may be molded to provide the shape illustrated. Connector body 11 may be shaped to form a mating interface 10. In the example of FIG. 1, a paddle card 13 extends from connector body 11 into mating interface 10. Paddle card 13 includes pads (not numbered) that serve as mating contacts for cable connector 1.

A cable 5 extends from connector body 11, here shown extending from a tail part. Conductors within cable 5 may be terminated to paddle card 13, making electrical contact to the pads. The end of cable 5 not terminated to cable connector 1 may be terminated to another connector or other component that may receive or generate signals passing through cable connector 1.

The rotating latch bar 3 may be made of a strong and slightly springy material. In the illustrated embodiment, the rotating latch bar 3 is made of metal. Here, the rotating latch bar 3 is made from a cylindrical metal bar that is bend to form multiple segments. Those segments comprise two connecting bars 31 disposed symmetrically on left and right sides of the connector body 11. One end of each of the two connecting bars 31 is rotatably mounted to a central portion position on a side edge of the connector body 11. In the illustrated embodiment, the mounting is formed by bending ends of connecting bars 31 at a right angle and inserting the end of the connecting bar into a hole in connector body 11. In the illustrated embodiment, each of the connecting bars 31 is round, as are the holes in connector body 11 into which those ends are inserted.

The other end of each of the two connecting bars 31 is bent perpendicularly inward to form two engagement arms 32. The engagement arms are separated from connector body 11 by a sufficient distance that a mating connector positioned within mating interface 10 may fit between engagement arms 32 and connector body 11.

Extremities of the two engagement arms 32 are bent perpendicularly upward to form two first connecting arms 33 (FIG. 3) respectively.

Extremities of the two first connecting arms 33 are bent obliquely toward a side of the connector body 11 to form two second connecting arms 34, respectively. Extremities of the two second connecting arms 34 are each bent perpendicularly inward and closed together to form a pull tab bar 35. A forward end of the pull tab 4 is fixed to the pull tab bar 35, such as by looping a strip of nylon around the pull tab bar 35 and adhering the two ends of the strip to each other. The forward end of the pull tab 4 is arranged obliquely with respect to the rotating latch bar 3. As can be seen, the pull tab bar 35 is offset, in a direction perpendicular to the two connecting bars 31, such that a force exerted on pull tab bar 35 as a result of a user pulling on pull tab 4 will result in a torque about the ends of two connecting bars 31 rotationally mounted in connector body 11 such that the forward end of rotating latch bar 3 rotates so as to separate from the mating connector.

As shown in FIG. 3, rotating latch bar 3 may be shaped such that pull tab bar 35 is approximately aligned with a upper surface of connector body 11. In such a configuration, the latching components may add little or no height to mated connectors. A similar result may be achieved in embodiments in which pull tab bar 35 is below an upper surface of connector body 11.

Figure 4:
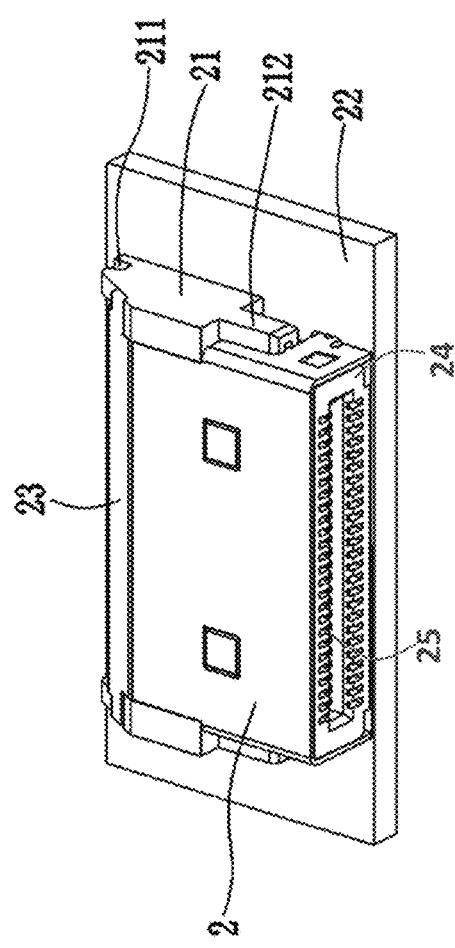
FIG. 4 is a perspective view of an exemplary embodiment of board connector, configured as a receptacle connector that can mate with the plug connector of FIG. 1.
Figure 5:
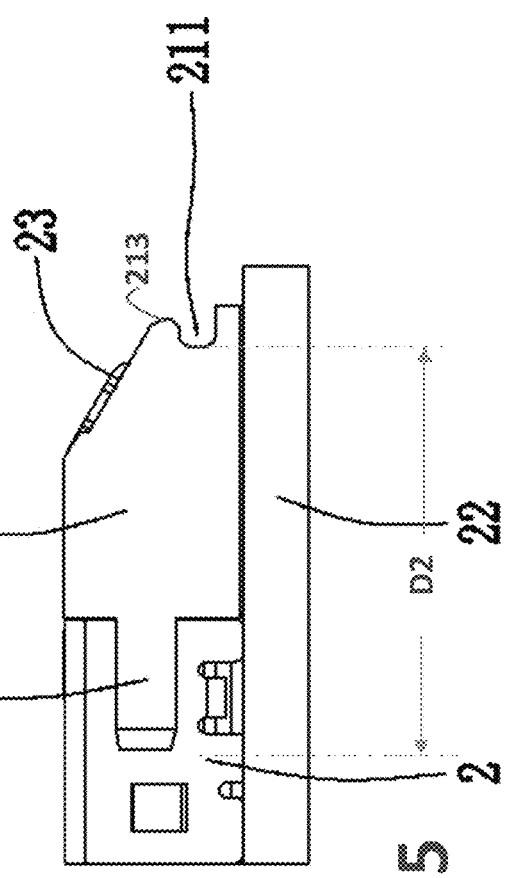
FIG. 5 is a schematic side view of the receptacle connector of FIG. 4.

The connector body 11 is provided with a mating interface 10 that receives a board connector 2 for mating. Mating interface 10 may be bounded by two arms 14 projecting from connector body 11. As shown in FIGS. 4 and 5, the board connector 2 may have a mating interface 24. In the embodiment illustrated, mating interface 24 may have a width that is less than the width of mating interface 10. Mating interface 24 may have a slot 25 lined with mating contacts. In this embodiment, the mating contacts (not numbered) line opposing sides of slot 25 top and bottom. In operation, cable connector 1 may be mated with board connector 2 so that paddle card 13 is inserted into slot 25. The mating contacts within slot 25 may make contact to the pads on paddle card 13.

The bottom of board connector 2 may be connected to a circuit board 22, a portion of which is illustrated. In an electronic system, a printed circuit board 22 may have electronic components, in addition to board connector 2 mounted to it. In some embodiments, board connector 2 may be mounted in a central portion of the printed circuit board 22.

Left and right sides of the board connector 2 are each provided with features that facilitate latching to cable connector 1. In the illustrated embodiment, those features are provided by an engagement block 21. The engagement blocks 21 may be formed as a portion of an insulative housing of board connector 2, such as via a molding operation. The engagement blocks 21 may be separately formed and then attached to the connector housing, but in the embodiment illustrated, the engagement blocks 21 are integrally formed with the rest of the connector housing. In the illustrated embodiment, engagement blocks 21 are spaced to align with arms 14 of cable connector 1.

Each engagement block 21 has, in the illustrated embodiment, an engagement slot 211 at an end remote from the mating interface 24. To latch cable connector 1 to board connector 2, the engagement arms 32 are engaged in the engagement slots 211. Accordingly, engagement arms 32 have a length that is at least as long as engagement block 21 is wide. Moreover, engagement slots 211 may have a back wall that is rounded so as to conform to the shape of rotating latch bar 3.

The engagement block 21 is provided with a projection 212 at an end close to the cable connector 1, and arm 14 is provided with a recess 12 for engaging with the projection 212. The board connector 2 is provided with an inclined face 23 at an end remote from the cable connector 1. In the illustrated embodiment, inclined face 23 is inclined at an angle of approximately 45 degrees with respect to a surface of board connector 2 mounted against board 22. In other embodiments, the angle of incline may be in the range of 40 to 50 degrees or between 30 and 40 degrees. The angle of incline of second connecting arms 34 relative to connecting bar 31 may be in these ranges, too, such that latch bar 3 follows the contour of inclined face 23. Inclined face 23, in addition to providing clearance for latch bar 3 as it rotates, provides a surface that, when downward pressure is applied on rotating latch bar 3, guides the forward, engagement end, of latch bar 3 into engagement slot 211.

Figure 7:
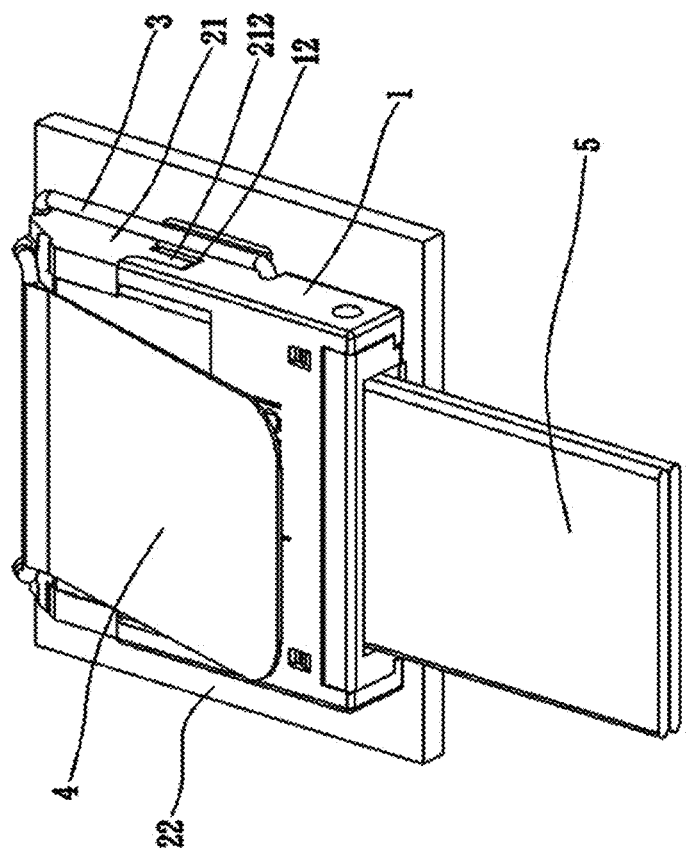
FIG. 7 is a schematic diagram of a connector assembly in a latched state.
Figure 6:
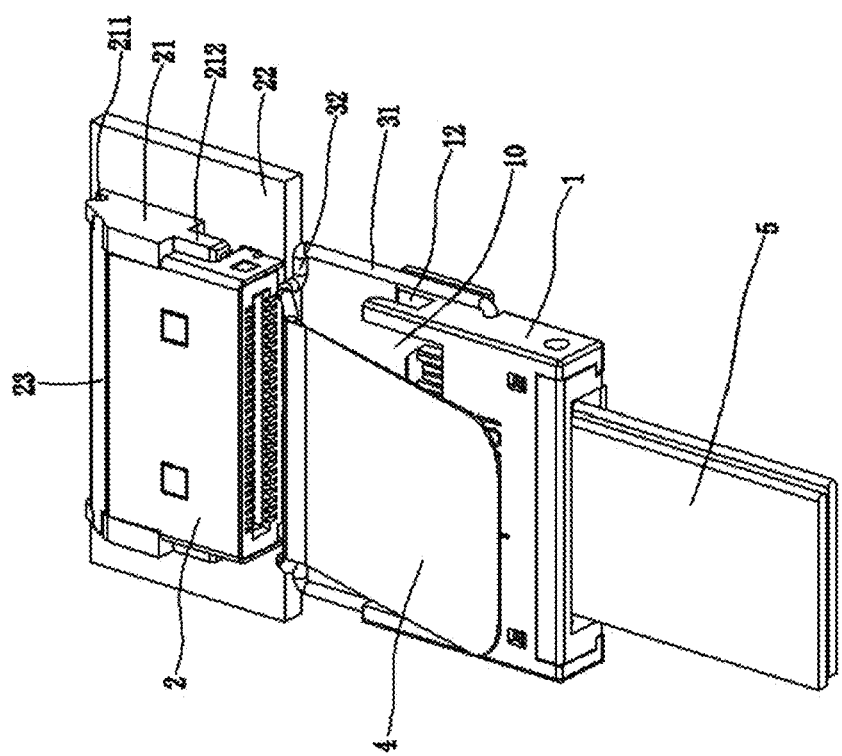
FIG. 6 is a perspective view of a connector assembly in an unlatched state, including a plug connector as in FIG. 1 and receptacle connector as in FIG. 4.

As shown in FIGS. 6 and 7, a connector assembly comprises the cable connector 1 and the board connector 2. The board connector 2 may be aligned with the mating interface 10 of the cable connector 1, with rotating locking bar 3 rotated away from board 22. In this configuration, board connector 2 and cable connector 1 may be brought together to mate. Cable connector 1 and the board connector 2 may then be latched together by rotating the rotating locking bar 3 toward board 22 such that engagement arms 32 on the rotating latch bar 3 engage with the engagement slots 211.

Engagement arms 32 may flex as rotating locking bar 3 is rotated such that engagement arms 32 pass over rounded end 213 of inclined face 23. Due to the springy nature of engagement arms 32, after clearing rounded end 213, engagement arms 32 may spring back into their un-flexed state such that they are securely positioned within engagement slot 211.

In the illustrated embodiment, the distance D1 between the bottom of recess 12 and engagement arms 32 is approximately the same as the distance D2 between the tips of projections 212 and the back wall of engagement slots 211. Such a configuration may hold cable connector 1 against board connector 2 with little or no movement, despite vibration of the connector assembly. In some embodiments, the distance D1 may be slightly less than the distance D2, such that the engagement arms 32 are deflected from their rest state when in engagement slots 211. As a result, engagement arms 32 may exert a spring force, pulling cable connector 1 towards board connector 2. In such a configuration, the risk of unmating of the connectors, even intermittently, is substantially reduced. Moreover, vibration of the mating contacts with respect to each other is reduced, further increasing reliability. Likewise, the relative position of the mating contacts in cable connector 1 and board connector 2 is controlled, such that the impedance of the signal path through the mating contacts is well controlled.

In the illustrated embodiment, when latched, rotating latch bar 3 restrains motion of cable connector 1 with respect to board connector 2 in a direction parallel to the insertion direction of paddle card 13 into slot 25. Motion in other directions may be restrained by other features. In the illustrated embodiment, projections 212 are shaped to conform with recesses 12. When cable connector 1 is mated with board connector 2, projections 212 fit within recesses 12, preventing upwards motion of cable connector 1 with respect to board connector 2. The fit of projections 212 into recesses 12 also restrains rotation of cable connector 1 with respect to board connector 2, protecting the mating interface and ensuring reliable connections.

When it is necessary to perform unlatching, the engagement arms 32 of the rotating latch bar 3 may be disengaged from the engagement slots 211 of the board connector 2 by applying force to the pull tab 4 in a direction away from the board connector 2. Cable connector 1 may then be withdrawn from board connector 2 at the same time as unlatching is accomplished, because the same pulling motion on pull tab 4 unlatches and withdraws cable connector 1 from board connector 2.

Figure 8:
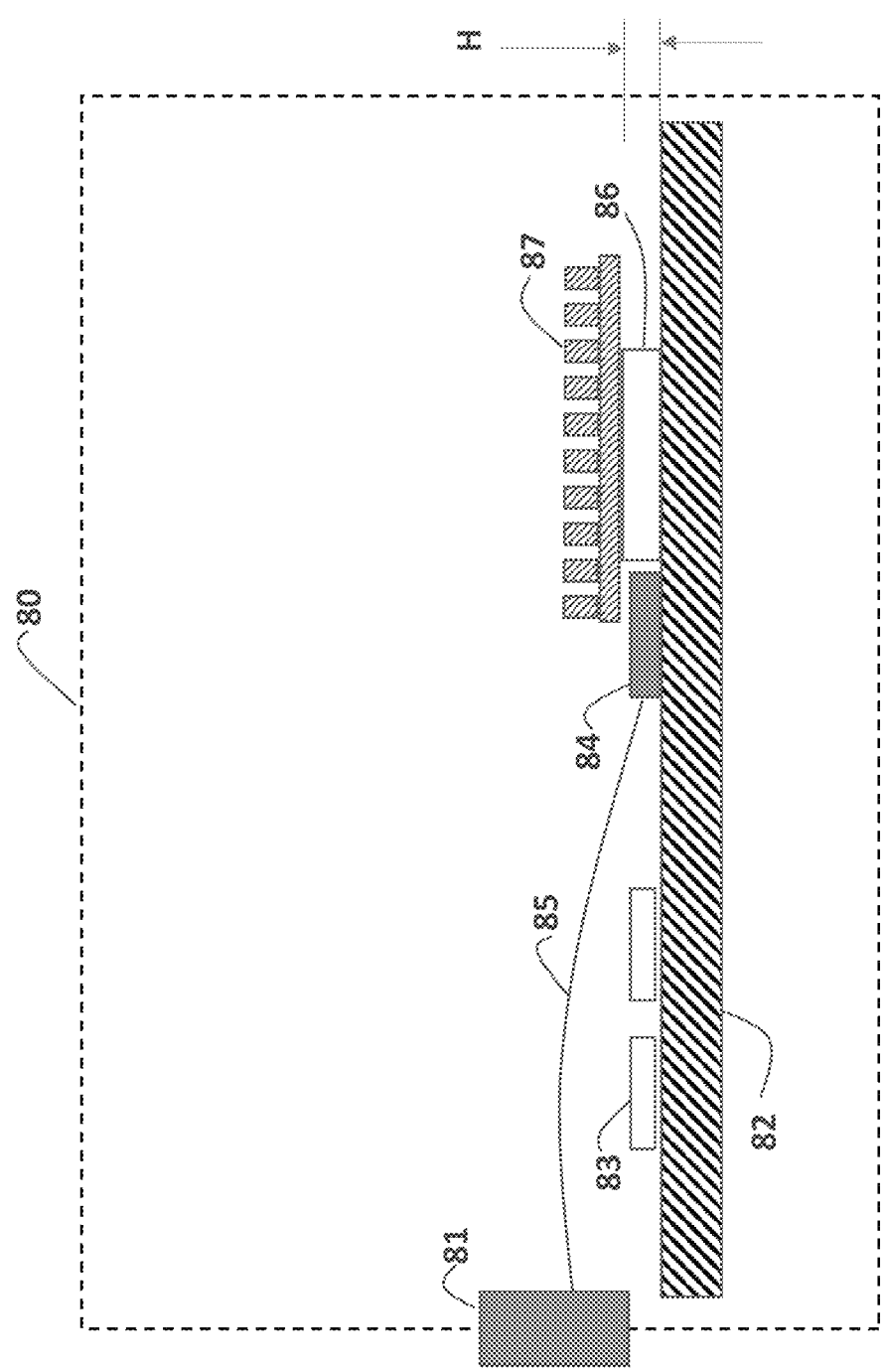
FIG. 8 is a schematic diagram of an exemplary embodiment of a compact electronic system using a connector as described herein.

A connector with a rotating latch bar may have a relatively short height such as less than 5 mm or approximately 4.5 mm, such as between 4 and 5 mm, in some embodiments. In some embodiments, the connector may be even shorter. For example, slot 25 in the mating interface and 24 may be lined with mating contacts on only one side, enabling a shorter connector, such as on the order of 3.5 mm, such that the connector may be proficient 3 and 4 mm, in some embodiments. FIG. 8 illustrates how such a short connector may enable construction of a compact electronic assembly.

FIG. 8 is a schematic illustration of an electronic device 80, which may be a server, switch or other electronic device. In the embodiment illustrated, electronic device 80 includes an electronic component, such processor 86, which processes a large number of high-speed electronic signals.

Processor 86, as well as other electronic components 83, are mounted to a printed circuit board 82. Signals may be routed to and from a processor 86 through traces in printed circuit board 82, as in conventional electronic system. Some of those signals may pass in and out of electronic device 83 with I/O connector 81. Here I/O connector 81 is shown mounted in an opening of an enclosure of electronic device 80.

For some electronic devices that process high-speed signals, the amount of signal loss that occurs in a path through printed circuit board 82 from I/O connector 81 to processor 86 may be unacceptably large. Such losses might occur, for example, in an electronic system processing 56 GHz or 112 GHz signals when the path through the printed circuit board 82 is approximately 6 inches or longer.

A low loss path may be provided through cables 85. In the electronic device illustrated in FIG. 8, cable 85 connects I/O connector 81 to a connector assembly 84 mounted to printed circuit board 82 near processor 86. The distance between connector assembly 84 and processor 86 may be of the order of 1 inch or less. Connector assembly 84 may be implemented using connectors as described herein. A board connector 2 may be mounted to printed circuit board 82 adjacent processor 86. A cable connector, such as cable connector 1, may terminate cable 85. Cable connector 1 may be plugged into board connector 2, creating connector assembly 84.

FIG. 8 illustrates that a short connector assembly as described herein may fit within a space that might otherwise be unusable within electronic device 80. As shown, a heat sink 87 may be attached to the top of processor 86. Heatsink 87 may extend beyond the periphery of processor 86. As a heat sink 87 is mounted above printed circuit board 82, there is a space between portions of heatsink 87 and printed circuit board 82. However, this space has a height H, which may be relatively small, such as 4.5 mm or less, and a conventional connector may be unable to fit within this space. A board connector, such as board connector 2, may fit within this space. For example, board connector two may be mounted to printed circuit board 82 adjacent to processor 86. A cable connector 1 may be plugged into board connector 2 and latched by rotating a rotating latch bar into place, as described above. Heatsink 87 may then be installed.

Such a configuration uses less space on printed circuit board 82 than if a connector were mounted to printed circuit board 82 outside the perimeter of heatsink 87. Such a configuration enables more electronic components 83 to be mounted to printed circuit board 82, increasing the functionality of electronic device 80. Alternatively, printed circuit board 82 may be made smaller, reducing its cost. Moreover, the integrity with which signals pass from connector assembly 84 to processor 86 may be increased relative to an electronic device in which a conventional connector is used to terminate cable 85, because the length of the signal path through printed circuit board 82 is less.

Although the present invention has been shown and presented specifically with reference to preferred embodiments, those skilled in the art will understand that various changes in form and detail made to the present invention within the spirit and scope of the present invention as defined in the attached claims are included in the scope of protection of the present invention.

Aspects of the techniques and technology described herein may enable an electrical connector to have improved the integrity of signals over a range of high frequencies, such as frequencies up to about 56 or 120 GHz or higher, while maintaining a small connector size. That is, the mating contacts of the connector may be maintained at a high density, such as an edge to edge spacing between adjacent conductive elements of approximately 0.25 mm or less, with a center-to-center spacing between adjacent contacts in a row of between 0.5 mm and 0.8 mm. The contacts may have a width of between 0.3 mm and 0.4 mm for some types of contacts, and may have a width of between 0.65 mm and 0.75 mm for other types of contacts.

It should be understood that various alterations, modifications, and improvements may be made to the structures, configurations, and methods discussed above, and are intended to be within the spirit and scope of the invention disclosed herein.

Further, although advantages of the present invention are indicated, it should be appreciated that not every embodiment of the invention will include every described advantage. Some embodiments may not implement any features described as advantageous herein. Accordingly, the foregoing description and attached drawings are by way of example only.

It should be understood that some aspects of the present technology may be embodied as one or more methods, and acts performed as part of a method of the present technology may be ordered in any suitable way. Accordingly, embodiments may be constructed in which acts are performed in an order different than shown and/or described, which may include performing some acts simultaneously, even though shown and/or described as sequential acts in various embodiments.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Further, terms denoting direction have been used, such as "left", "right", "forward" or "up". These terms are relative to the illustrated embodiments, as depicted in the drawings, for ease of understanding. It should be understood that the components as described herein may be used in any suitable orientation.

Use of ordinal terms such as "first," "second," "third," etc., in the description and the claims to modify an element does not by itself connote any priority, precedence, or order of one element over another, or the temporal order in which acts of a method are performed, but are used merely as labels to distinguish one element or act having a certain name from another element or act having a same name (but for use of the ordinal term) to distinguish the elements or acts.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

As used herein in the specification and in the claims, the phrase "equal" or "the same" in reference to two values (e.g., distances, widths, etc.) means that two values are the same within manufacturing tolerances. Thus, two values being equal, or the same, may mean that the two values are different from one another by ±5%.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

Also, the phraseology and terminology used herein is for the purpose of description and should not be regarded as limiting. Use of terms such as "including," "comprising," "comprised of," "having," "containing," and "involving," and variations thereof herein, is meant to encompass the items listed thereafter and equivalents thereof as well as additional items.

The terms "approximately" and "about" if used herein may be construed to mean within ±20% of a target value in some embodiments, within ±10% of a target value in some embodiments, within ±5% of a target value in some embodiments, and within ±2% of a target value in some embodiments. The terms "approximately" and "about" may equal the target value.

The term "substantially" if used herein may be construed to mean within 95% of a target value in some embodiments, within 98% of a target value in some embodiments, within 99% of a target value in some embodiments, and within 99.5% of a target value in some embodiments. In some embodiments, the term "substantially" may equal 100% of the target value.

What is claimed is:

1. A cable connector, comprising:
a connector body;
a rotating latch bar comprising a connection end and an engagement end;
a pull tab attached around the rotating latch bar;
a cable extending from the connector body;
wherein:
    one end of the connection end is rotatably mounted on the connector body, and another end of the connection end is fixed to the engagement end;
    the connection end comprises two connecting bars disposed symmetrically on opposite sides of the connector body; and
    each of the two connecting bars has one end rotatably mounted on the connector body and another end fixed to the engagement end,
    the engagement end comprises engagement arms, first connecting arms, second connecting arms and a pull tab bar;
    extremities of the two connecting bars are bent perpendicularly inward to form two engagement arms respectively;
    extremities of the two engagement arms are bent perpendicularly upward to form two first connecting arms;
    extremities of the two first connecting arms are bent obliquely toward a side of the connector body to form two second connecting arms; and
    extremities of the two second connecting arms are each bent perpendicularly inward and bent together to form the pull tab bar.

2. A cable connector, comprising:
a connector body;
a rotating latch bar comprising a connection end and an engagement end;
a pull tab;
a cable extending from the connector body;
wherein:
    one end of the connection end is rotatably mounted on the connector body, and another end of the connection end is fixed to the engagement end;
    the engagement end is inclined upward;
    the connection end comprises two connecting bars disposed on opposite sides of the connector body;

each of the two connecting bars has one end rotatably mounted on the connector body and another end fixed to the engagement end, the engagement end comprises engagement arms, first connecting arms, second connecting arms and a pull tab bar;

a forward end of the pull tab is attached to the pull tab bar; and the forward end of the pull tab is offset from the engagement arms in a direction perpendicular to the two connecting bars and in a direction parallel to the two connecting bars.

3. The cable connector as claimed in claim 2, wherein the pull tab is in the form of a belt, and a material of the pull tab is rubber or nylon.

4. The cable connector as claimed in claim 2, wherein a material of the pull tab bar is metal.

5. A connector assembly, comprising a cable connector and a board connector, wherein:
the cable connector comprises:
a connector body;
a rotating latch bar comprising a connection end and an engagement end;
a pull tab; and
a cable extending from the connector body;
wherein:
one end of the connection end is rotatably mounted on the connector body, and another end of the connection end is fixed to the engagement end;
the connection end comprises two connecting bars disposed symmetrically on opposite sides of the connector body, the two connecting bars having a long dimension, the long dimension of each being disposed within a same plane;
the engagement end is inclined upward and out of the plane of the two connecting bars;
the pull tab is fixed to the engagement end at an upper side of the engagement end;
a bottom of the board connector is configured for connection to a circuit board;
the cable connector comprises a mating interface receiving the board connector;
opposing sides of the board connector each comprise an engagement block;
the engagement block comprises an engagement slot at an end remote from the cable connector; and
the engagement end of the rotating latch bar is engaged with the engagement slot.

6. The connector assembly as claimed in claim 5, wherein:
the engagement block comprises a projection at an end close to the cable connector; and
a forward end of the cable connector is provided with a recess for engaging with the projection.

7. The connector assembly as claimed in claim 5, wherein the board connector is provided with an inclined face at an end remote from the cable connector.

8. A method of operating the connector assembly as claimed in claim 5, wherein the method comprises the following steps:
S1: to assemble, inserting the board connector into the slot of the cable connector, and rotating the rotating latch bar such that the engagement end of the rotating latch bar is engaged in the engagement slots of the board connector, to complete the assembly of the connector assembly;
S2: to unlatch the assembled cable connector and board connector, pulling the pull tab toward a side remote from the board connector, such that the pull tab drives the engagement end of the rotating latch bar to disengage from the engagement slots of the board connector, to accomplish unlatching and separation of the cable connector and the board connector.

9. The method of operating the connector assembly as claimed in claim 8, wherein:
when the assembly of the connector assembly is completed, the engagement end of rotating latch bar exerts a spring force that urges the cable connector and the board connector together.

10. The method of operating the connector assembly as claimed in claim 8, wherein:
the rotating latch bar is rotationally coupled to the cable connector at a first height relative to a printed circuit board to which the board connector is mounted, and
pulling the pull tab exerts a force on a segment of the rotating latch bar a second height, greater than the first height.

11. An electronic system, comprising:
a printed circuit board;
a high speed electronic component mounted to the printed circuit board;
a board connector mounted adjacent to the high speed electronic component, wherein the board connector comprises a housing comprising an upper surface and an engagement slot;
a cable connector mated with the board connector;
a latch bar rotatably mounted to the cable connector and latching the cable connector and the board connector, wherein the latch bar comprises a plurality of bends defining a plurality of segments including a connection end comprising two connecting bars disposed within a same plane, an engagement segment coupled to the connection end and disposed within the engagement slot, and a pull tab segment disposed above the engagement segment, wherein the engagement segment and the pull tab segment are connected by engagement arms, the engagement arms including extremities that are bent upward to form first connecting arms such that the engagement segment is inclined upward out of the plane of the two connecting bars; and
a pull tab attached to the pull tab segment.

12. The electronic system of claim 11, wherein:
the system further comprises a heat sink mounted attached to the processor; and
the board connector is disposed at least in part below the periphery of the heat sink.

13. The electronic system of claim 12, further comprising:
an I/O connector; and
a cable coupling the cable connector to the I/O connector.

14. The electronic system of claim 13, wherein:
the housing the board connector has a height less than 5 mm, a mating interface perpendicular to the printed circuit board and a slot in the mating interface.

15. The electronic system of claim 11, wherein:
the pull tab segment is aligned with or below the upper surface of the housing of the board connector.

16. The electronic system of claim 11, wherein:
the upper surface of the housing of the board connector comprises an inclined portion leading to the engagement slot.

17. The electronic system of claim 11, wherein:
the board connector comprises two blocks, on opposing sides of the housing;
each block comprises, at one end, an engagement slot, and, at an opposing end, a projection extending parallel to the printed circuit board.

18. The electronic system of claim 17, wherein:
the cable connector comprises two slots, and the projections are engaged in respective ones of the two slots.

19. A board connector, comprising:
a housing comprising a mating interface on a first side of the housing, the mating interface comprising a mating slot;
an upper surface perpendicular to the mating interface;
an engagement slot configured to receive a latch bar disposed on a second side of the housing opposite the first side of the housing; and
an inclined surface inclined toward the engagement slot, disposed adjacent the engagement slot, and joining the upper surface with the second side of the housing.

20. The board connector of claim 19, wherein:
the engagement slot is a first engagement slot and the housing further comprises a second engagement slot;
the housing further comprises engagement blocks on opposing sides of the board connector, and the engagement blocks each comprise a respective one of the first engagement slot and the second engagement slot.

21. The board connector of claim 20, wherein:
the first and second engagement blocks comprise projections at an end of the engagement block opposite the engagement slot.

22. The board connector of claim 19, wherein:
the upper surface of the housing comprises an inclined face at an end adjacent the engagement slots.

23. The board connector of claim 22, wherein:
the housing has a height less than 5 mm.

* * * * *

UNITED STATES PATENT AND TRADEMARK OFFICE
CERTIFICATE OF CORRECTION

PATENT NO.         : 10,938,157 B2
APPLICATION NO.    : 16/299542
DATED              : March 2, 2021
INVENTOR(S)        : Wen Chu Yang et al.

Page 1 of 1

It is certified that error appears in the above-identified patent and that said Letters Patent is hereby corrected as shown below:

On the Title Page

At (71), the 1st Applicant should read:
Amphenol AssembleTech (Xiamen) Co., Ltd., Xiamen (CN)

At (73), the 1st Assignee should read:
Amphenol AssembleTech (Xiamen) Co., Ltd., Xiamen (CN)

At (30), the Foreign Application Priority Data should read:
Sep. 3, 2018     (CN) ......................201811021374.6
Sep. 3, 2018     (CN) ......................201821434180.4

Signed and Sealed this
First Day of June, 2021

Drew Hirshfeld
*Performing the Functions and Duties of the*
*Under Secretary of Commerce for Intellectual Property and*
*Director of the United States Patent and Trademark Office*